(12) United States Patent
Zhang et al.

(10) Patent No.: US 8,921,839 B2
(45) Date of Patent: Dec. 30, 2014

(54) LIGHT EMITTING DEVICE WITH SPHERICAL BACK MIRROR

(71) Applicant: Sharp Laboratories of America, Inc., Camas, WA (US)

(72) Inventors: Jingyu Zhang, Camas, WA (US); Ken Hoshino, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 13/797,340

(22) Filed: Mar. 12, 2013

(65) Prior Publication Data
US 2014/0264291 A1    Sep. 18, 2014

(51) Int. Cl.
| H01L 35/24 | (2006.01) |
| H01L 51/00 | (2006.01) |
| H01L 51/52 | (2006.01) |
| H01L 51/56 | (2006.01) |

(52) U.S. Cl.
CPC ............ *H01L 51/5271* (2013.01); *H01L 51/56* (2013.01)
USPC .. 257/40; 257/98; 257/E51.018; 257/E51.022

(58) Field of Classification Search
CPC ............ H01L 51/5265; H01L 51/5262; H01L 51/5012; H01L 51/5048; H01L 51/5271; H01L 51/5088; H01L 33/465; H01L 27/3225; H01L 2924/12044; H01L 2251/5307; H01L 51/5275
USPC ........................ 257/40, 98, E51.018, E51.022
See application file for complete search history.

(56) References Cited

U.S. PATENT DOCUMENTS

| 7,957,621 | B2 | 6/2011 | Zhang et al. | |
| 2004/0211971 | A1* | 10/2004 | Takei et al. | 257/98 |
| 2010/0201256 | A1 | 8/2010 | Xue et al. | |
| 2011/0260201 | A1* | 10/2011 | Klein et al. | 257/99 |
| 2011/0262093 | A1 | 10/2011 | Lamansky et al. | |
| 2012/0161610 | A1 | 6/2012 | Levermore et al. | |
| 2012/0200929 | A1 | 8/2012 | Lu | |

FOREIGN PATENT DOCUMENTS

| EP | 2294628 | 3/2011 |
| JP | 2006-221902 | 8/2006 |
| WO | WO03/096755 | 11/2003 |

OTHER PUBLICATIONS

Akiyoshi Mikami et al., "Optical Design of Enhanced Light Extraction Efficiency in Multi-Stacked OLEDs . . . ", SID 2012 Digest • 683.

* cited by examiner

*Primary Examiner* — Thien F Tran
(74) *Attorney, Agent, or Firm* — Law Office of Gerald Maliszewski; Gerald Maliszewski

(57) ABSTRACT

A method is provided for fabricating an organic light emitting device (OLED) with a spherical back mirror. The method forms a spherical curvature in the substrate and deposits a metal film overlying the spherical curvature, forming a spherical back mirror. A transparent isolation layer is formed overlying the spherical back mirror having a planar top surface. A transparent first electrode layer is formed overlying the isolation layer, and a transparent second electrode layer is formed overlying the first electrode layer. A stack is interposed between the first and second electrode layers. The stack is made up of an electron transport layer adjacent the cathode, a light-emitting (electron injection) layer adjacent to the electron transport layer, a hole transport layer adjacent to the light-emitting layer, and a hole injection layer adjacent to the hole transport layer. The order of the stack layering is dependent which electrode is the anode.

8 Claims, 9 Drawing Sheets

LIGHT EMITTING DEVICE WITH SPHERICAL BACK MIRROR

BACKGROUND OF THE INVENTION

1. Field of the Invention

This invention generally relates to organic light emitting devices (OLEDs) and, more particularly, to an OLED with a spherical back mirror for improved light extraction.

2. Description of the Related Art

As noted in Wikipedia, an OLED (organic light-emitting diode) is a light-emitting diode (LED) in which the emissive electroluminescent layer is a film of organic compound which emits light in response to an electric current. This layer of organic semiconductor is situated between two electrodes. Generally, at least one of these electrodes is transparent. OLEDs are used to create digital displays in devices such as television screens, computer monitors, portable systems such as mobile phones, handheld games consoles, and PDAs.

There are two main families of OLEDs: those based on small molecules and those employing polymers. Adding mobile ions to an OLED creates a light-emitting electrochemical cell, which has a slightly different mode of operation. OLED displays can use either passive-matrix (PMOLED) or active-matrix addressing schemes. Active-matrix OLEDs (AMOLED) require a thin-film transistor backplane to switch each individual pixel on or off, but allow for higher resolution and larger display sizes.

An OLED display works without a backlight. Thus, it can display deep black levels and can be thinner and lighter than a liquid crystal display (LCD). In low ambient light conditions such as a dark room an OLED screen can achieve a higher contrast ratio than an LCD, whether the LCD uses cold cathode fluorescent lamps or LED backlight.

Multilayer OLEDs can be fabricated with two or more layers in order to improve device efficiency. As well as conductive properties, different materials may be chosen to aid charge injection at the electrodes by providing a more gradual electronic profile, or block a charge from reaching the opposite electrode and being wasted. Many modern OLEDs incorporate a simple bilayer structure, consisting of a conductive layer and an emissive layer. The emissive layer may be understood as comprising a light-emission or electron injection layer, and an electron transport layer. Likewise, the conductive layer may be understood as comprising a hole injection layer and a hole transport layer.

During operation, a voltage is applied across the OLED such that the anode is positive with respect to the cathode. A current of electrons flows through the device from cathode to anode, as electrons are injected into the lowest unoccupied molecular orbit (LUMO) of the organic layer at the cathode and withdrawn from the highest occupied molecular orbit (HOMO) at the anode. This latter process may also be described as the injection of electron holes into the HOMO. Electrostatic forces bring the electrons and the holes towards each other and they recombine forming an exciton, a bound state of the electron and hole. This happens closer to the emissive layer, because in organic semiconductors holes are generally more mobile than electrons. The decay of this excited state results in a relaxation of the energy levels of the electron, accompanied by emission of radiation whose frequency is in the visible region. The frequency of this radiation depends on the band gap of the material, in this case the difference in energy between the HOMO and LUMO.

Indium tin oxide (ITO) is commonly used as the anode material. It is transparent to visible light and has a high work function which promotes injection of holes into the HOMO level of the organic layer. A typical conductive layer may consist of poly(3,4-ethylenedioxythiophene):poly(styrenesulfonate) [PEDOT:PSS] as the HOMO level of this material generally lies between the workfunction of ITO and the HOMO of other commonly used polymers, reducing the energy barriers for hole injection. Metals such as barium and calcium are often used for the cathode as they have low work functions which promote injection of electrons into the LUMO of the organic layer. Such metals are reactive, so they require a capping layer of aluminum to avoid degradation.

FIG. 1 is a partial cross-sectional view of an OLED (prior art). Layer 1 represents a stack comprising an electron transport layer, electron injection layer, and a cathode electrode. Likewise, layer 2 represents a stack comprising a hole transport layer, hole injection layer, and the anode electrode. Electron emission occurs at the interface between layer 1 and layer 2. The figure depicts energy loss in OLED structure due to the internal total reflection of high index waveguide.

$\theta c2$ is the critical angle for the media interface of n3 and n2. $\theta c1$ is the critical angle for the media interface of n2 and n1. $\theta c0$ is the incident angle to metallic mirror when a ray reaches critical angle $\theta c2$. The index of refraction for organic layer 1, organic layer 2, and isolation layer are all close to n1, and n1>n2>n3.

$$\theta c1 = \arcsin\left(\frac{n2}{n1}\right)$$

$$\theta c2 = \arcsin\left(\frac{n3}{n1}\right)$$

$$\theta c0 = \arcsin\left(\frac{n2 \cdot \sin(\theta c2)}{n1}\right)$$

For example, if n1=1.75, n2=1.5, and n3=1.0 the critical angle of $\theta c1 \approx 59°$, $\theta c2 \approx 42°$, and $\theta c0 \approx 35°$. A back reflecting mirror can collected particle light and enhanced extraction efficiency. However, only the back propagation of light at $\theta < \theta c0$ can be extracted out. The back propagation of light at $\theta > \theta c1$ is confined in isolation layer (n=n1). The back propagation light with $\theta c0 < \theta < \theta c1$ is confined in the media of index n1 and n2.

FIG. 2 is a plot of the external extraction efficiency of the structure of FIG. 1 plotted as a function of organic layer 1 (OL1) thickness using a finite-difference time-domain simulation (prior art). The light source is located at the interface of organic layer 1 and organic layer 2. The light source is an incoherent dipole source at a wavelength of 450 nanometers (nm). The extraction efficiency into substrate is ~43% and that into air is close to 20% at 450 nm, with the thickness of layer 2 set to 250 nm.

It would be advantageous if the light extraction efficiency of an OLED could be improved.

SUMMARY OF THE INVENTION

Disclosed herein is an organic light emitting device (OLED) device with a spherical back cavity having a metallic coating. An inversible light system of caustics is exploited for improving the light collimation, thereby reducing the total internal reflection in the OLED. A caustic is an envelope of light rays reflected or refracted by a curved surface. With the emitting layer locating at ⅕ to ⅖ of spherical radius from bottom edge of mirror, a 40% light extraction efficiency into air can be reached, which is double the 20% light extraction efficiency with planar backcavity OLED design (see FIG. 2).

A fabrication process flow is also provided. After lithography, a spherical bowl shape is fabricated by isotropic wet etching, following the metallic deposition of Ag, Al, Au, W, Mo, MoW, and then spin coating a high index of refraction (e.g. n=1.75) isolation layer, organic layers, and cathode/anode layers. A glass substrate may cap the top of the device.

Accordingly, a method is provided for fabricating an organic light emitting device (OLED) with a spherical back mirror. The method forms a spherical curvature in the substrate and deposits a metal film overlying the spherical curvature, forming a spherical back mirror. A transparent isolation layer is formed overlying the spherical back mirror having a planar top surface. A transparent first electrode layer is formed overlying the isolation layer, and a transparent second electrode layer is formed overlying the first electrode layer. A stack is interposed between the first and second electrode layers. The stack is made up of an electron transport layer adjacent the cathode, a light-emitting (electron injection) layer adjacent to the electron transport layer, a hole transport layer adjacent to the light-emitting layer, and a hole injection layer adjacent to the hole transport layer. The order of the stack layering is dependent upon which electrode is the anode and which electrode is the cathode.

The spherical back mirror has a spherical curve (R) in a first plane orthogonal to the first electrode bottom surface and the isolation layer has a thickness (h1) between the center the spherical back mirror and the first electrode layer bottom surface. The thickness between the first electrode bottom surface and the light-emission layer/hole transport layer interface is h2, and typically (h1+h2)/R is in the range of 0.2 to 0.4.

Additional details of the above described method and an OLED with a spherical back mirror are provided below.

DETAILED DESCRIPTION

Figure 3A:
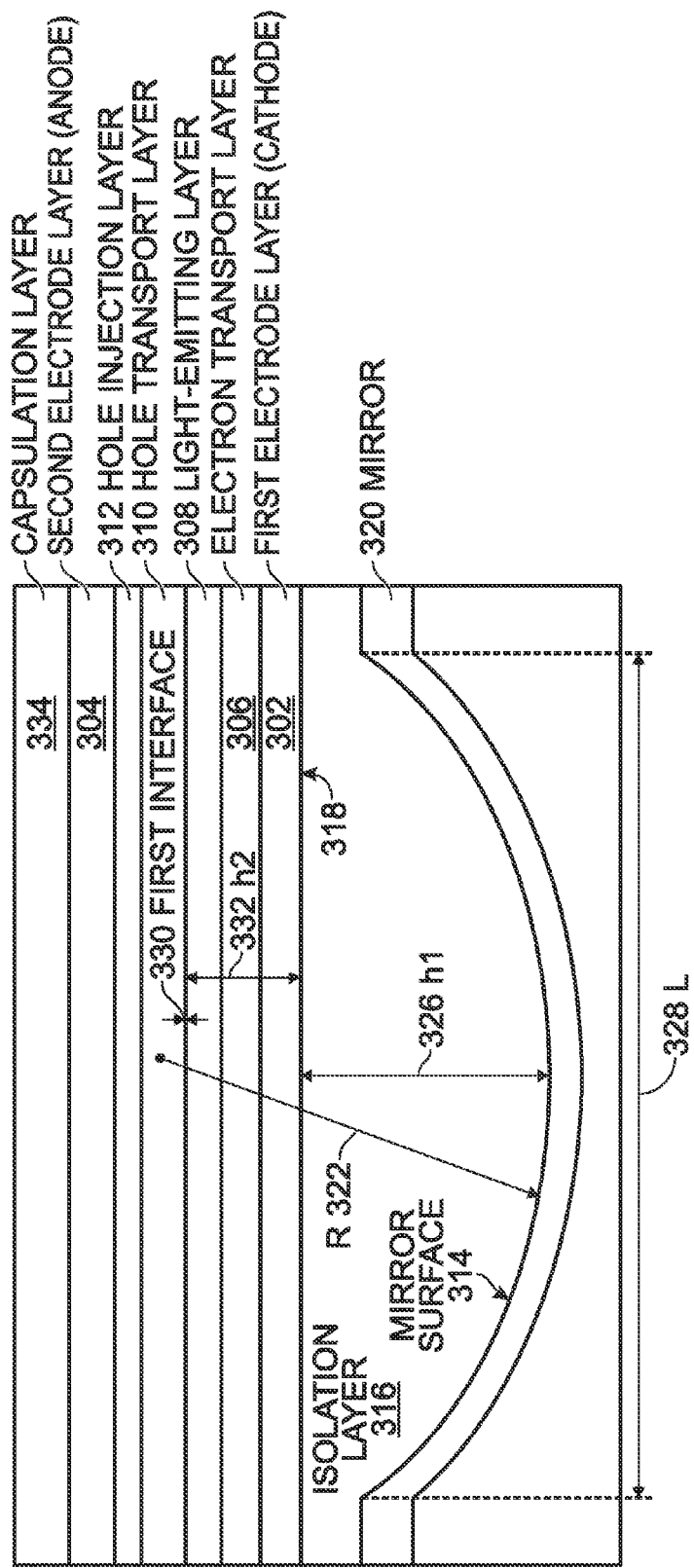
FIGS. 3A and 3B are partial cross-sectional views of an OLED with a spherical back mirror.
Figure 3B:
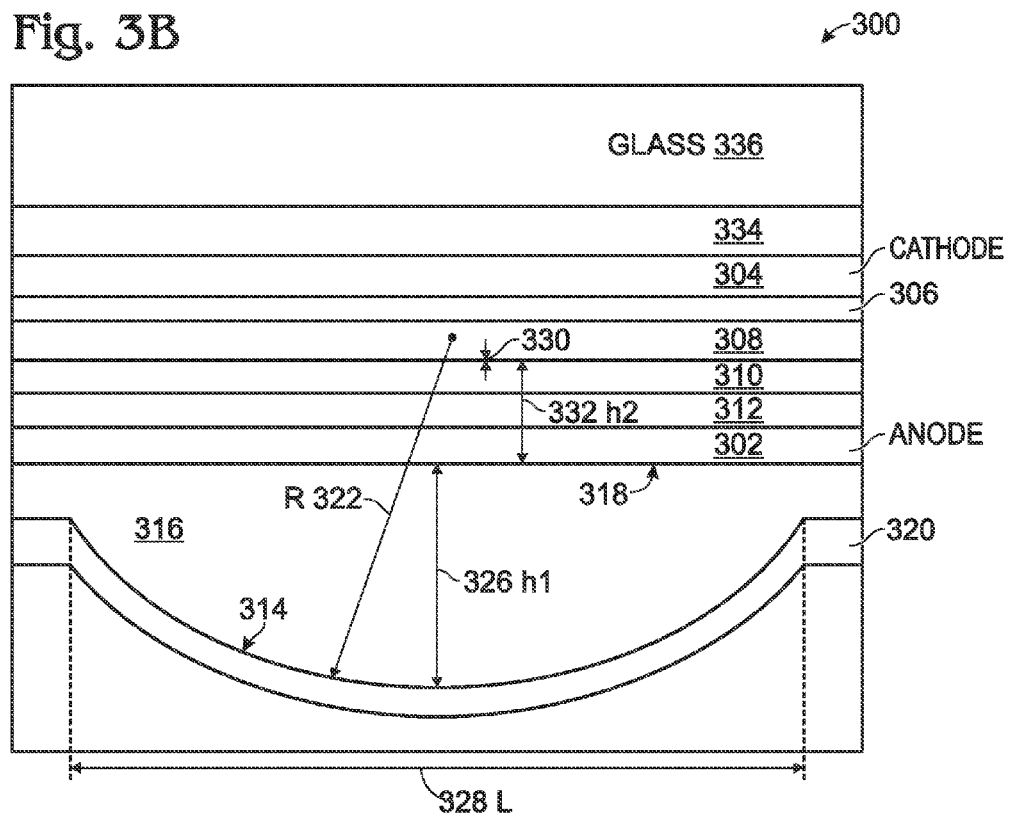

FIGS. 3A and 3B are partial cross-sectional views of an OLED with a spherical back mirror. The OLED 300 comprises a transparent first electrode layer 302 and a transparent second electrode layer 304 overlying the first electrode layer. An electron transport layer 306 is interposed between the first electrode layer 302 and second electrode layer 304. A light-emitting or electron injection layer 308 is adjacent to (i.e. in direct contact with) the electron transport layer 306. A hole transport layer 310 is adjacent to the light-emitting layer 308. A hole injection layer 312 is adjacent to the hole transport layer 310. A spherical back mirror concave top surface 314 underlies the first electrode layer 302. A transparent isolation layer 316 is interposed between the first electrode layer 302 and the spherical back mirror concave surface 314. As shown in FIG. 3A, the first electrode 302 is a cathode. As shown in FIG. 3B, the first electrode 302 is an anode.

Referencing either FIG. 3A or 3B, the first electrode layer 302 has a bottom surface 318. The spherical back mirror 320 has a spherical curve defined by the radius of curvature (R) 322. The isolation layer 316 has a thickness (h1) 326 between the center the spherical back mirror 320 and the first electrode layer bottom surface 318. A first interface 330 exists between the light-emission layer 308 and the hole transport layer 310, and the distance between the first interface and the first electrode layer bottom surface is h2 (332). In one aspect, (h1+h2)/R is in the range of 0.2 to 0.4. In the case of a circular-shaped spherical back mirror 320, the spherical curve is defined by a uniform radius of curvature (the spherical shape is circular as seen from above). Otherwise, the spherical back mirror 320 may have a non-circular shape. Typically, the spherical back mirror 320 has a maximum length 328 in the range of 3.6 to 176 microns.

In one aspect h2 is in the range of 100 to 300 nanometers (nm). It is also typical that the value of R be in the range of 3 to 110 microns, and h1 be in the range of 0.6 to 44 microns. However, it should be understood that the OLED 300 is not limited to any particular physical dimensions.

In one aspect as shown in FIG. 3A, the OLED 300 further comprises an inorganic capsulation layer 334 overlying the second electrode layer 304. In another aspect as shown in FIG. 3B, the OLED further comprises both the inorganic capsulation layer 334 and a glass (or like material) layer 336 overlying the inorganic capsulation layer 334. Note: although not shown, the device of FIG. 3B made be made without the glass layer and the device of FIG. 3A may include a glass layer.

In one aspect, the spherical back mirror 320 is a material such as Ag, Al, W, Mo, MoW, or Au, However, other highly reflective materials (e.g. with a reflectivity of greater than 90% in the visible wavelengths of light) may be used. In another aspect, the isolation layer, first electrode layer, light-emitting layer, electron transport layer, hole injection layer, hole transport layer, and second electrode layer have a refractive index of 1.75, with a tolerance of ±6%, in the visible wavelengths of light.

Figure 4:
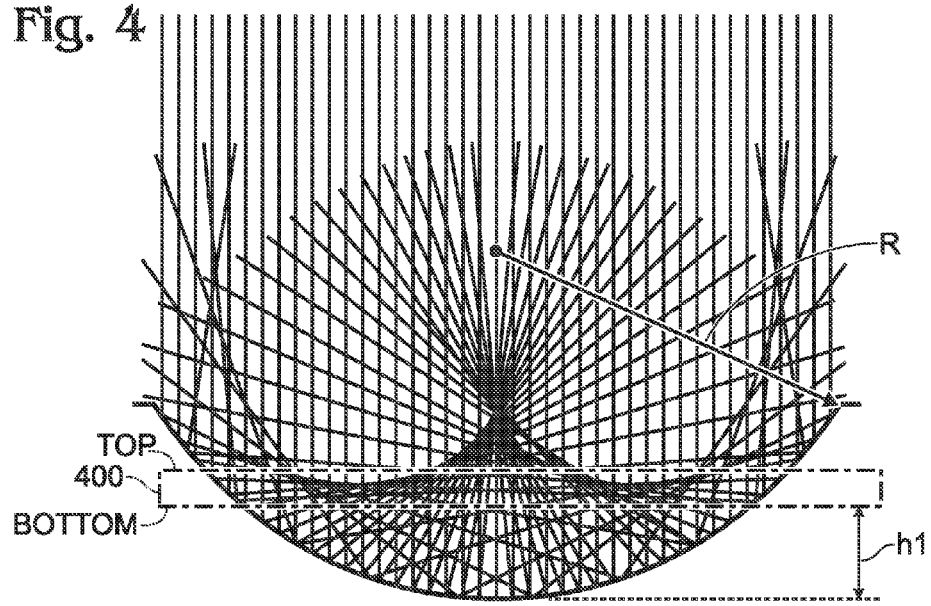
FIG. 4 is a diagram depicting the reflective caustics of parallel lines upon a circular reflective surface.

FIG. 4 is a diagram depicting the reflective caustics of parallel lines upon a circular reflective surface. The OLEDs described above take advantage of the caustics associated with a spherical metallic surface. Area 400 includes a condensed ray density associated with large reflected angles. h1 is the distance from area 400 to the bottom of curve, and R is the radius of the curve. Because optical ray tracing is an inversible system, this system can be used for OLED design. When the emitting layer of OLED is located within area 400, a substantial portion of the back propagation light is reflected out of the device in collimation, thereby reducing total internal reflection. Roughly, the range of distance values for points inside area 400 is around 0.2R to 0.4R for the best OLED extraction efficiency. In one aspect, the distance to the bottom of area 400 (h1) divided by R is 0.2, and the distance to the top of area 400 divided by R is 0.4.

Figure 5:
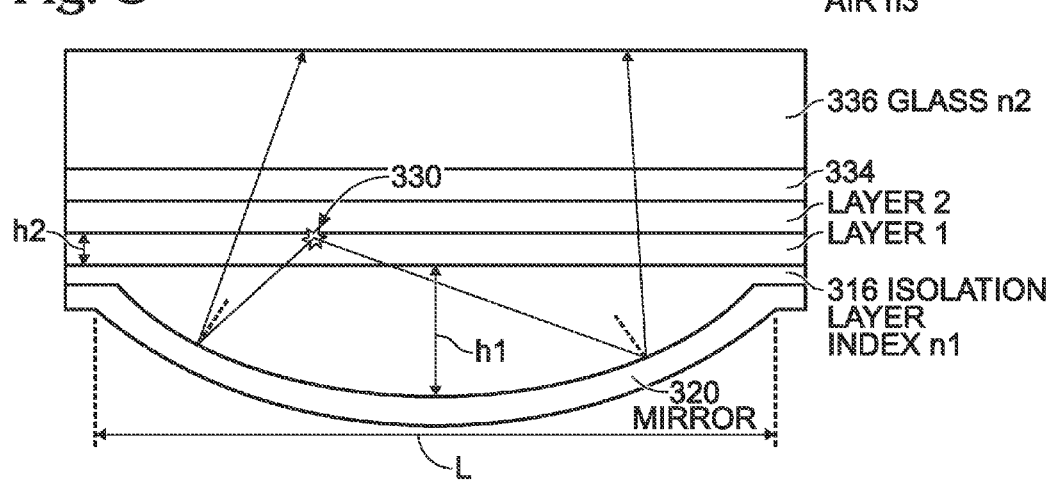
FIG. 5 is a partial cross-sectional of the device of FIG. 3A or 3B.

FIG. 5 is a partial cross-sectional of the device of FIG. 3A or 3B. Here, the cathode, electron transport, and light-emitting layer are represented by either layer 1 or layer 2. Likewise, the anode, hole injection, and hole transport layer are represented by the other of layer 1 or layer 2. For example, if the cathode, electron transport, and light-emitting layer are layer 1, then the anode, hole injection, and hole transport layer are layer 2. As shown in the figure, some back propagation rays are extracted out of the device without being lost to total internal reflection. In one example, the length (L) and width (not shown) are both 12 microns. The radius of the spherical curve (R) is 5 microns, and h1 is 1.4 microns.

Figure 6:
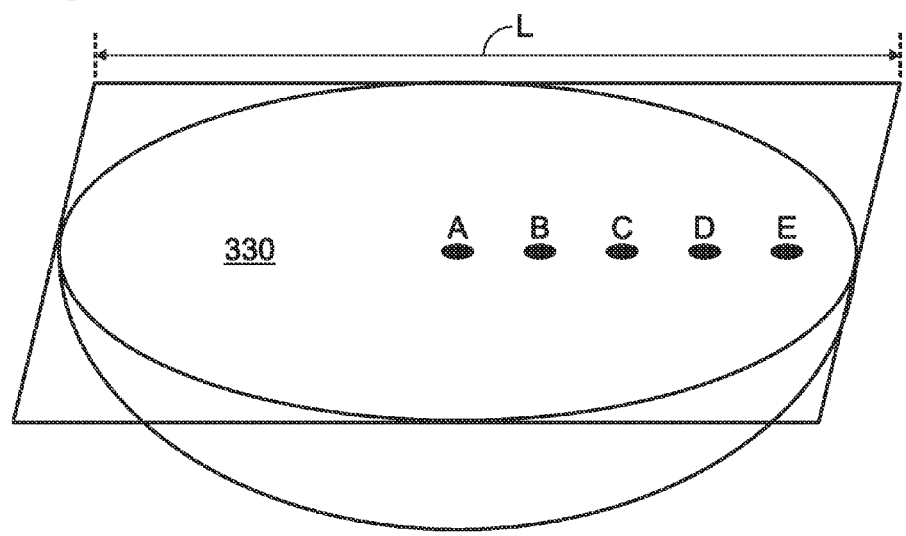
FIG. 6 is a schematic diagram depicting a light source at five three-dimensional dipole positions along the plane of the first interface.
Figure 7A:
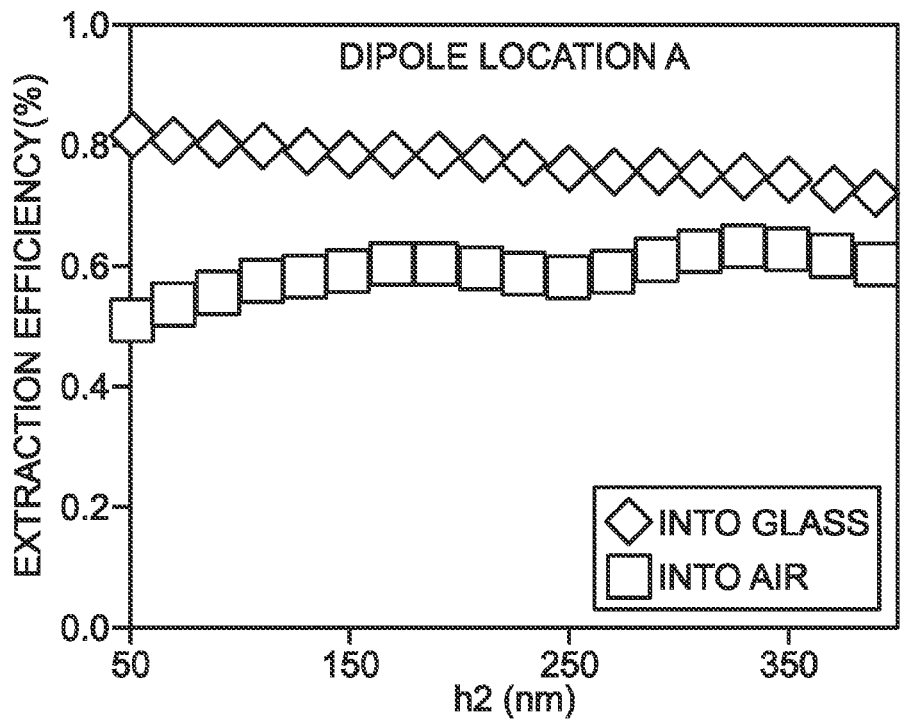
FIGS. 7A through 7E are plots of extraction efficiency as a function of organic layer 1 (h2) thickness and dipole position.
Figure 7B:
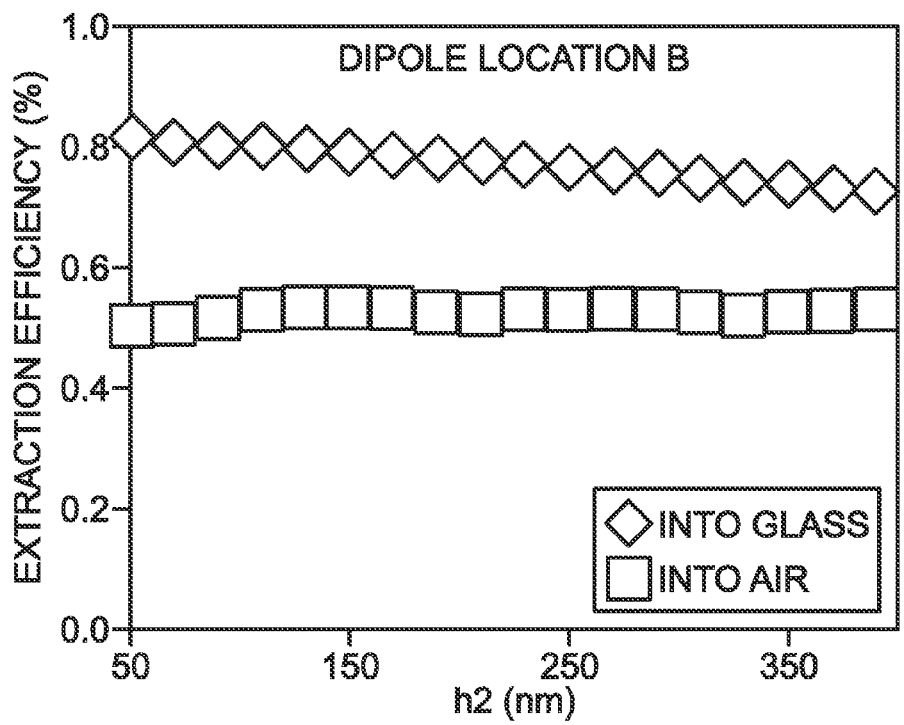
Figure 7C:
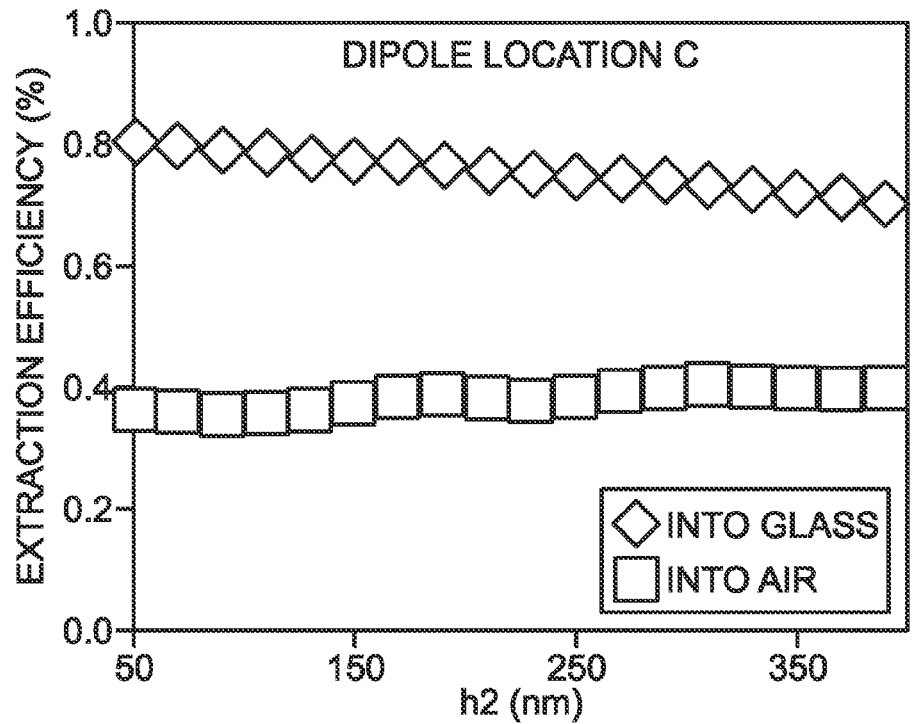
Figure 7D:
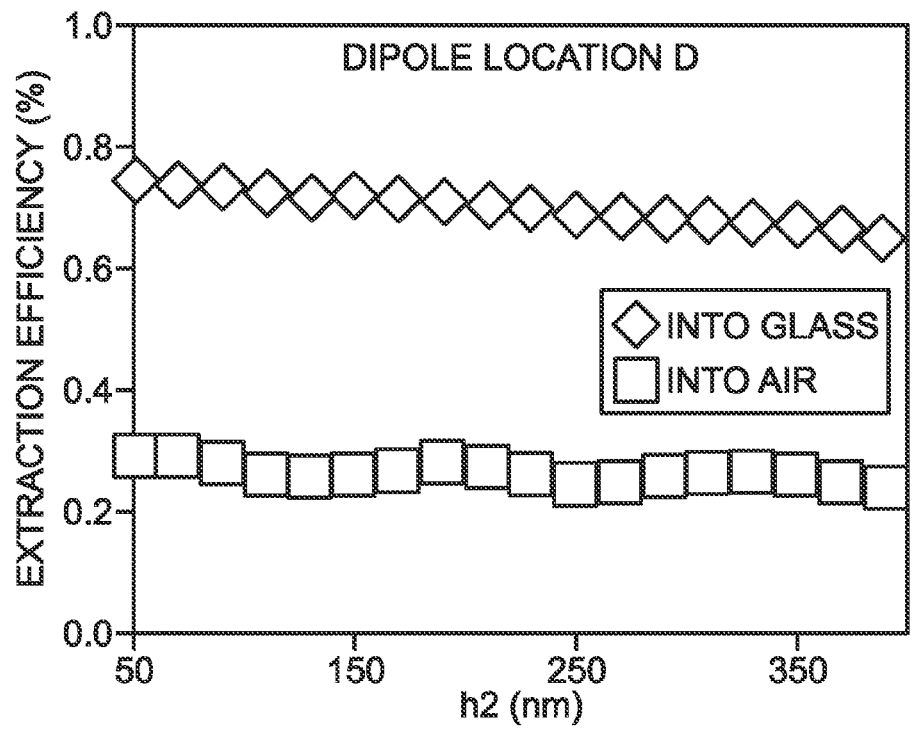
Figure 7E:
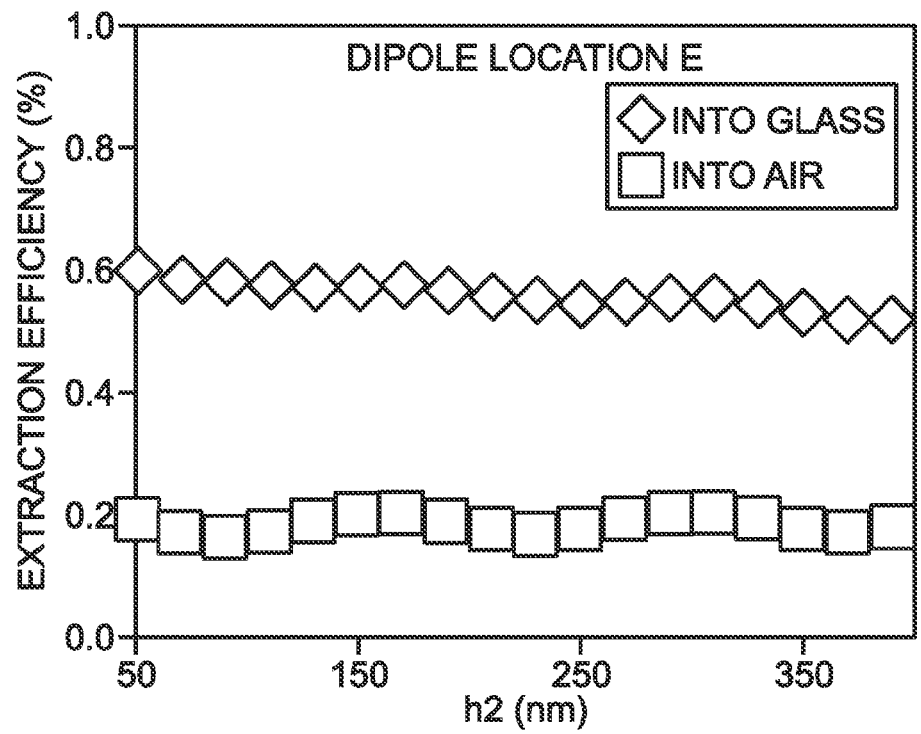

FIG. 6 is a schematic diagram depicting a light source at five three-dimensional dipole positions along the plane of the first interface.

FIGS. 7A through 7E are plots of extraction efficiency as a function of organic layer 1 (h2) thickness and dipole position. Dipole position A is located above the center the spherical back mirror (FIG. 7A), with dipole positions B. C. D, and E, respectively associated with FIGS. 7B through 7E. The top set of points in each graph is the light extraction efficiency into glass, and bottom set of points is the extraction efficiency into air.

Figure 1:
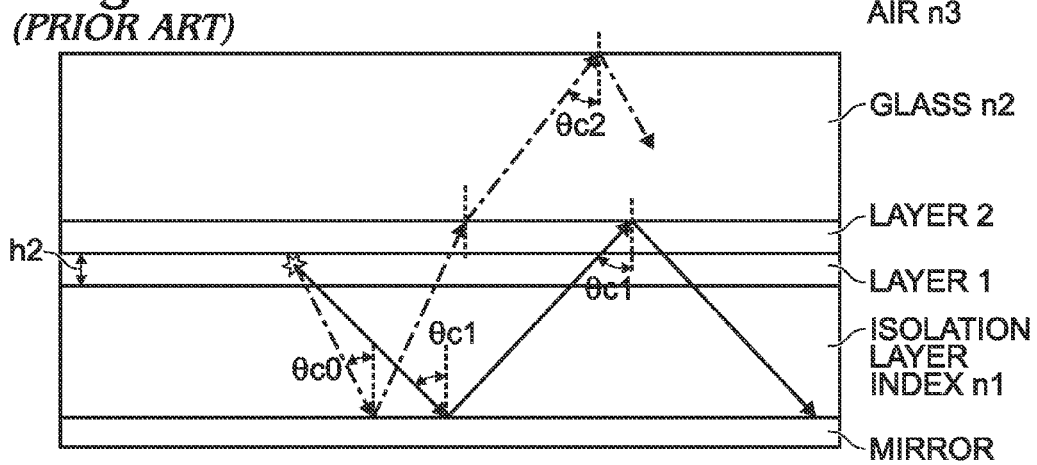
FIG. 1 is a partial cross-sectional view of an OLED (prior art).
Figure 2:
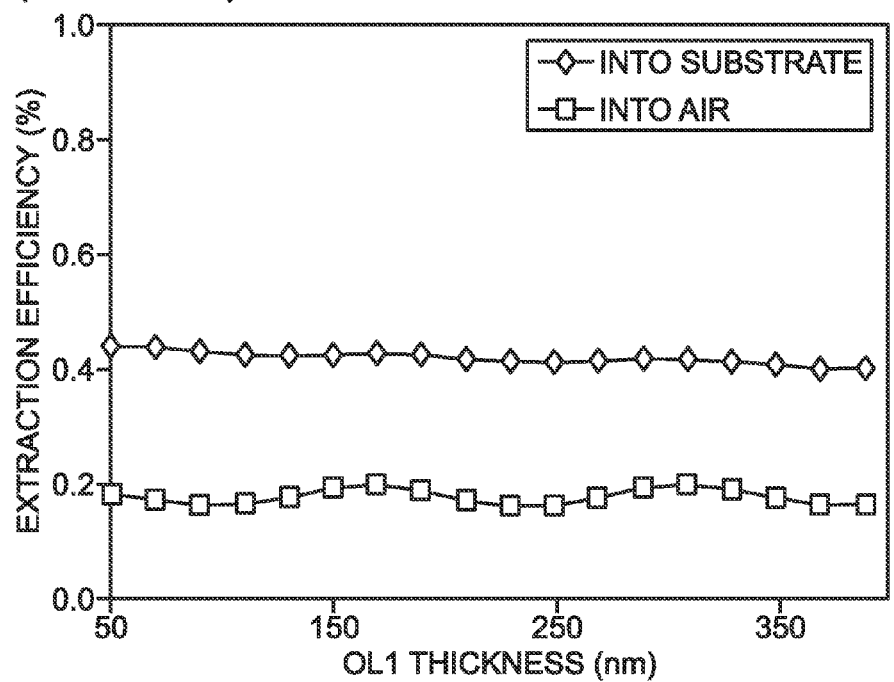
FIG. 2 is a plot of the external extraction efficiency of the structure of FIG. 1 plotted as a function of organic layer 1 (OL1) thickness using a finite-difference time-domain simulation (prior art).

The center dipole energy (FIG. 7A) is extracted at an efficiency of ~80% into glass and ~60% into air. With the movement of dipole position to E, the extraction efficiency into glass drops to ~57% and that into air drops into ~20%. However, even the extraction efficiency at edge position E is larger than that of the planer OLED design (40% into glass and ~18% into air), see FIG. 2.

Figure 8:
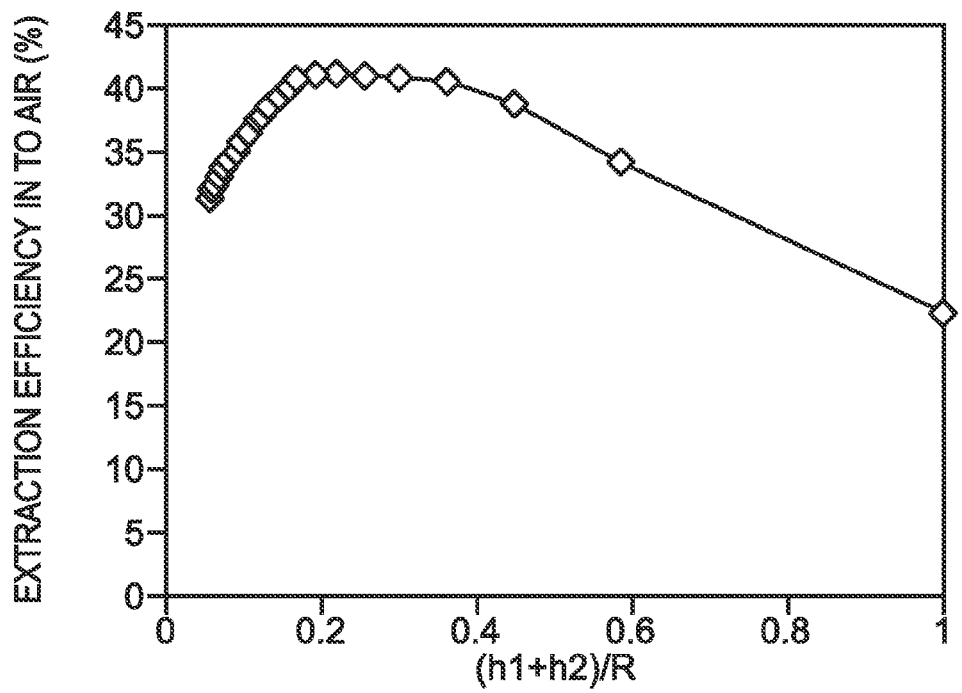
FIG. 8 is a graph depicting the light extraction efficiency from a planar light source, into air, as a function of (h1+h2)/R.

FIG. 8 is a graph depicting the light extraction efficiency from a planar light source, into air, as a function of (h1+h2)/R. With (h1+h2)/R values from 0.2 to 0.4, the extraction efficiency is above 40%, which means for a R=5 micron spherical mirror, the h1 can be ranged from 1 to 2 microns, which gives the design a large tolerance for easy fabrication.

Figure 9A:
FIGS. 9A through 9F depict steps in an exemplary spherical back mirror OLED fabrication process.
Figure 9B:
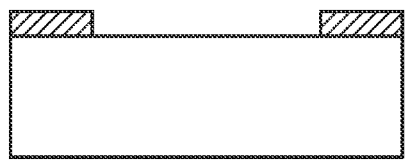
Figure 9C:
Figure 9D:
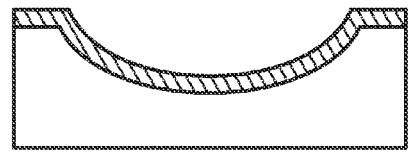
Figure 9E:
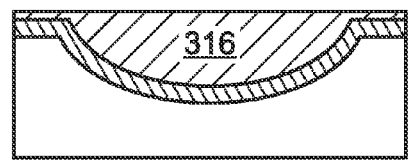
Figure 9F:
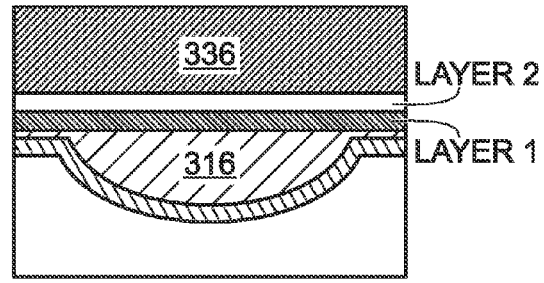

FIGS. 9A through 9F depict steps in an exemplary spherical back mirror OLED fabrication process. In FIG. 9A a sample is prepared with thick dielectric or semiconductor substrate, which is thicker than 1 micron. In FIG. 9B lithography is used to define a mask. In FIG. 9C the substrate is wet etched to about 1.3 to 1.5 microns deep if the radius of spherical mirror is 5 microns. Due to an isotropic wet etching, a spherical 3D curve is formed. In FIG. 9l) the mask is removed and a metallic film is deposited (e.g. 100 nm thickness). The metal may be Ag, Al, Au, W, Mo, MoW, etc., with a shiny surface. In FIG. 9E a high refractive index dielectric isolation layer is deposited by spin coating. In FIG. 9F organic layers 1 and 2 are deposited by spin coating or printing, and covered by a glass substrate.

In summary, the OLED design with spherical metallic reflector increases the collimation of back propagation light. The extraction efficiency into air is ~40% with a curvature ((h1+h2)/R of 0.2 to 0.4), which is double that of OLED with planar metallic reflector. The refractive index of the isolation layer, organic layer 1 and layer 2, capsulation layer are typically close to 1.75. The index of glass is 1.5, and the index of air is 1.

Figure 10:
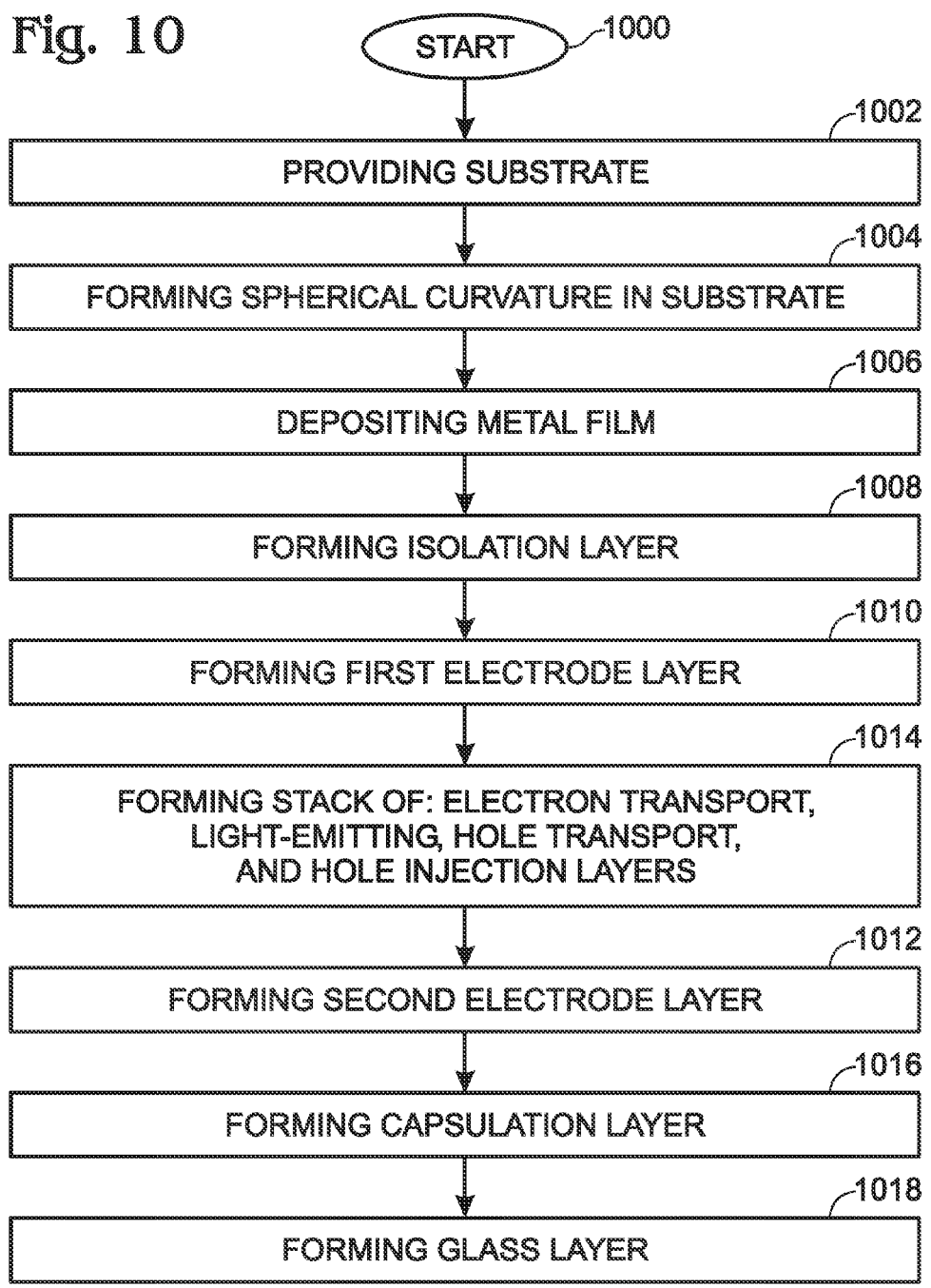
FIG. 10 is a flowchart illustrating a method for fabricating an OLED with a spherical back mirror.

FIG. 10 is a flowchart illustrating a method for fabricating an OLED with a spherical back mirror. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1000.

Step 1002 provides a substrate. Step 1004 forms a spherical curvature in the substrate. Step 1006 deposits a metal film overlying the spherical curvature, forming a spherical back mirror. Step 1008 forms a transparent isolation layer overlying the spherical back mirror having a planar top surface. Step 1010 forms a transparent first electrode layer overlying the isolation layer. Step 1012 forms a transparent second electrode layer overlying the first electrode layer. Step 1014 forms a stack interposed between the first and second electrode layers comprising: an electron transport layer; a light-emitting layer adjacent to the electron transport layer; a hole transport layer adjacent to the light-emitting layer; and, a hole injection layer adjacent to the hole transport layer. When the first electrode layer is a cathode, the electron transport layer is adjacent the first electrode layer. Otherwise, the electron transport layer is adjacent the second electrode layer. Note: Step 1012 is performed after Step 1014. Step 1016 forms an inorganic capsulation layer overlying the second electrode layer. In some aspects. Step 1018 forms a glass layer overlying the inorganic capsulation layer.

More particularly, Step 1010 forms the first electrode layer with a bottom surface, and Step 1006 forms the spherical back mirror with a spherical curve defined by a radius of curvature (R). Forming the stack in Step 1014 includes forming a first interface between the light emission layer and the hole transport layer, where the distance between the first interface and the first electrode layer bottom surface is h2. Then, forming the isolation layer in Step 1008 includes forming the isolation layer with a thickness (h1) between the center the spherical back mirror and the first electrode layer bottom surface, where (h1+h2)/R is in the range of 0.2 to 0.4. In another aspect, forming the stack in Step 1014 includes h2 being in the range of 100 to 300 nm. Continuing the example, the spherical back mirror formed in Step 1006 may have a value of R in the range of 3 to 110 microns and a maximum length (L) in the range of 3.6 to 176 microns, and the value of h1 formed in Step 1008 may be in the range of 0.6 to 44 microns. Typically, the spherical back mirror formed is Step 1006 has a uniform radius of curvature, and is made from a material such as Ag, Al, W, Mo, MoW, or Au.

In one aspect, forming the insulation layer (Step 1008), first electrode layer (Step 1010), light-emitting layer, electron transport layer, hole injection layer, and hole transport layer (Step 1014), and second electrode layer (Step 1012) includes forming the above-mentioned layers having a refractive index of 1.75, with a tolerance of ±6%, in the visible wavelengths of light.

An OLED with spherical back mirror has been presented. Examples of particular dimensions, materials, and processes have been presented to illustrate the invention. However, the invention is not limited to merely these examples. Although the OLED has been described in the context of a bilayer device, the OLED is not limited to any particular number of layers. Other variations and embodiments of the invention will occur to those skilled in the art.

We claim:
1. An organic light, emitting device (OLED) with a spherical back mirror, the LED comprising:
   a transparent first electrode layer;
   a transparent second electrode layer overlying the first electrode layer;
   an electron transport layer interposed between the first and second electrode layers;
   a light-emitting layer adjacent to the electron transport layer;
   a hole transport layer adjacent to the light-emitting layer;

a hole injection layer adjacent to the hole transport layer; and, a spherical back mirror concave top surface underlying the first electrode layer;

a transparent isolation layer interposed between the first electrode layer and the spherical back mirror concave surface;

wherein the first electrode layer has a bottom surface;

wherein the spherical back mirror has a spherical curve defined by a radius of curvature (R);

wherein a first interface exists between the light-emission layer and the hole transport layer;

wherein a distance between the first interface and the first electrode layer bottom surface is h2;

wherein the isolation layer has a thickness (h1) between a center the spherical back mirror and the first electrode layer bottom surface; and, wherein (h1+h2)/R is in a range of 0.2 to 0.4.

2. The OLED of claim 1 wherein h2 is in a range of 100 to 300 nanometers (nm);

wherein the spherical back mirror has a value of R in a range of 3 to 110 microns; and, wherein h1 is in a range of 0.6 to 44 microns.

3. The OLED of claim 1 further comprising:

an inorganic capsulation layer overlying the second electrode layer.

4. The OLED of claim 3 further comprising:

a glass layer overlying the inorganic capsulation layer.

5. The OLED of claim 1 wherein the spherical back mirror has a maximum length in a range of 3.6 to 176 microns.

6. The OLED of claim 1 wherein the spherical back mirror has a uniform radius of curvature.

7. The OLED of claim 1 wherein the spherical back mirror is a material selected from a group consisting of Ag, Al, W, Mo, MoW, and Au.

8. The OLED of claim 1 wherein the isolation layer, first electrode layer, light-emitting layer, electron transport layer, hole injection layer, hole transport layer, and second electrode layer each have a refractive index of 1.75, with a tolerance of ±6%, in the visible wavelengths of light.

\* \* \* \* \*